United States Patent
Hsieh et al.

(10) Patent No.: US 9,860,980 B1
(45) Date of Patent: Jan. 2, 2018

(54) CIRCUIT BOARD ELEMENT

(71) Applicant: Unimicron Technology Corp., Taoyuan (TW)

(72) Inventors: Yu-Chung Hsieh, Taoyuan (TW); Chun-Hsien Chien, Taoyuan (TW); Wei-Ti Lin, Taoyuan (TW); Yu-Hua Chen, Hsinchu (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 15/273,672

(22) Filed: Sep. 22, 2016

(30) Foreign Application Priority Data

Jul. 5, 2016 (TW) .............................. 105121258 A

(51) Int. Cl.
*H05K 1/02* (2006.01)
*H05K 1/03* (2006.01)

(52) U.S. Cl.
CPC ......... *H05K 1/0306* (2013.01); *H05K 1/0271* (2013.01); *H05K 2201/0154* (2013.01); *H05K 2201/0175* (2013.01); *H05K 2201/068* (2013.01)

(58) Field of Classification Search
CPC ... H05K 1/0271; H05K 1/0284; H05K 1/0306
See application file for complete search history.

(56) References Cited

U.S. PATENT DOCUMENTS

| 7,224,028 | B2* | 5/2007 | Suzawa | H01L 27/1214 257/223 |
| 2005/0151227 | A1* | 7/2005 | Chen | H01L 21/31053 257/620 |
| 2006/0254302 | A1* | 11/2006 | Byrne | G07F 11/24 62/378 |
| 2007/0146598 | A1* | 6/2007 | Yokokawa | G02F 1/1337 349/123 |
| 2010/0107130 | A1* | 4/2010 | Bowers | G06F 17/5045 716/106 |
| 2016/0156817 | A1* | 6/2016 | Tezuka | H01L 27/14689 348/374 |

FOREIGN PATENT DOCUMENTS

| TW | 550983 B | 9/2003 |
| TW | 200845860 A | 11/2008 |
| TW | 201615068 A | 4/2016 |

* cited by examiner

*Primary Examiner* — Hoa C Nguyen
(74) *Attorney, Agent, or Firm* — CKC & Partners Co., Ltd.

(57) ABSTRACT

A circuit board element includes a glass substrate, a first dielectric layer, and a first patterned metal layer. The glass substrate has an edge. The first dielectric layer is disposed on the glass substrate and has a central region and an edge region. The edge region is in contact with the edge of the glass substrate, and the thickness of the central region is greater than the thickness of the edge region. The first patterned metal layer is disposed on the glass substrate and in the central region of the first dielectric layer.

10 Claims, 4 Drawing Sheets

CIRCUIT BOARD ELEMENT

RELATED APPLICATIONS

This application claims priority to Taiwanese Application Serial Number 105121258, filed Jul. 5, 2016, which are herein incorporated by reference.

BACKGROUND

Technical Field

The present disclosure relates to a circuit board element.

Description of Related Art

With the rapid growth of the electronics industry, the R & D of electronic products has gradually been directed to the pursuit of versatility and high performance. In order to achieve the requirements of high integration and miniaturization of semiconductor components, the requirements of circuit boards also increase. For example, the line width and pitch of a circuit board is required to become smaller and smaller, and the thickness of the circuit board is required to become smaller and smaller. As these requirements of circuit boards continue, some unexpected problems may arise.

To further improve the circuit boards, persons in the industry have made every endeavor to discover new solutions. The application and improvement of the circuit boards has become one of the most important research topics.

SUMMARY

This disclosure provides a method for manufacturing a circuit redistribution structure to enhance the structure stability and the wiring density of the circuit redistribution structure and reduce the thickness and the manufacturing cost of the circuit redistribution structure.

In one aspect of the disclosure, a circuit board element is provided. A circuit board element includes a glass substrate, a first dielectric layer, and a first patterned metal layer. The glass substrate has an edge. The first dielectric layer is disposed on the glass substrate and has a central region and an edge region. The edge region is in contact with the edge of the glass substrate, and the thickness of the central region is greater than the thickness of the edge region. The first patterned metal layer is disposed on the glass substrate and in the central region of the first dielectric layer.

In one or more embodiments, the glass substrate and the first dielectric layer are made of different materials.

In one or more embodiments, the first dielectric layer is made of ajinomoto build-up film (ABF), pregpreg (PP), polyimide (PI), or photoimageable dielectric (PID).

In one or more embodiments, the central region has a top surface, and the edge region has a top surface. The top surface of the central region and the top surface of the edge region are not located on the same plane.

In one or more embodiments, the top surface of the edge region is an inclined surface relative to the top surface of the central region.

In one or more embodiments, the edge region is further divided into a plurality of sub-regions, and thicknesses of the sub-regions are different from each other.

In one or more embodiments, the central region has a top surface, and each of the sub-regions has a top surface. Any two of the top surface of the central region and the top surfaces of the sub-regions are not located on the same plane.

In one or more embodiments, the central region has a top surface, and each of the sub-regions has a top surface. At least one of the top surfaces of the sub-regions is an inclined surface relative to the top surface of the central region.

In one or more embodiments, the edge is a first side surface, and the edge region has a second side surface. The first side surface is connected to the second side surface.

In one or more embodiments, the second side surface is an inclined surface relative to the first side surface.

When the reliability test of a conventional circuit board element is performed, the circuit board element will experience high and low temperatures, and thermal stress of the dielectric layer will be applied to the edges of the glass substrate when the dielectric layer experiences high and low temperatures. Since there may be small defects on the edges of the glass substrate due to the cutting process, the thermal stress applied to the glass substrate by the dielectric layer may break the glass substrate, such that the circuit board element may be damaged.

In the aforementioned embodiments, the thickness of the edge region of the first dielectric layer and the edge region of the second dielectric layer is smaller, so the thermal stress applied to the edge of the glass substrate by the first dielectric layer and the second dielectric layer will be smaller, such that the small defects will not be affected by the thermal stress and the glass substrate will not be broken. Therefore, the circuit board element can pass the reliability test.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to achieve the requirements of high integration and miniaturization of semiconductor components, the line width and pitch of the circuit boards coupled with their respective chips is required to become smaller and smaller. When the size of the circuit board becomes smaller and smaller, some unexpected problems may arise. A method for manufacturing a circuit board element is provided to solve the associated problems.

FIGS. 1A to 1F are schematic cross-sectional views of intermediate steps in a method for manufacturing a circuit board element 300 according to one embodiment of this disclosure. The thickness of the circuit board element 300 is smaller than about 1100 μm.

Figure 1A:
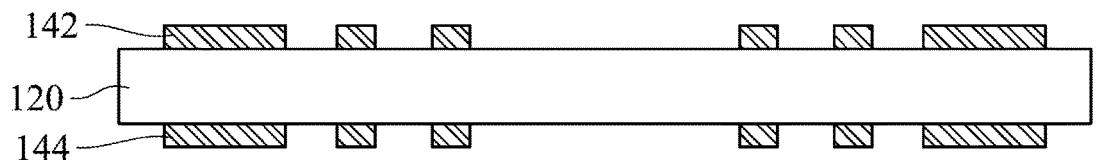
FIGS. 1A to 1F are schematic cross-sectional views of intermediate steps in a method for manufacturing a circuit board element according to one embodiment of this disclosure.

First, as shown in FIG. 1A, a first patterned metal layer 142 and a second patterned metal layer 144 are formed on two sides of a glass substrate 120. The thickness of the glass substrate 120 is in a range between about 20 μm to about 500 μm.

Figure 1B:
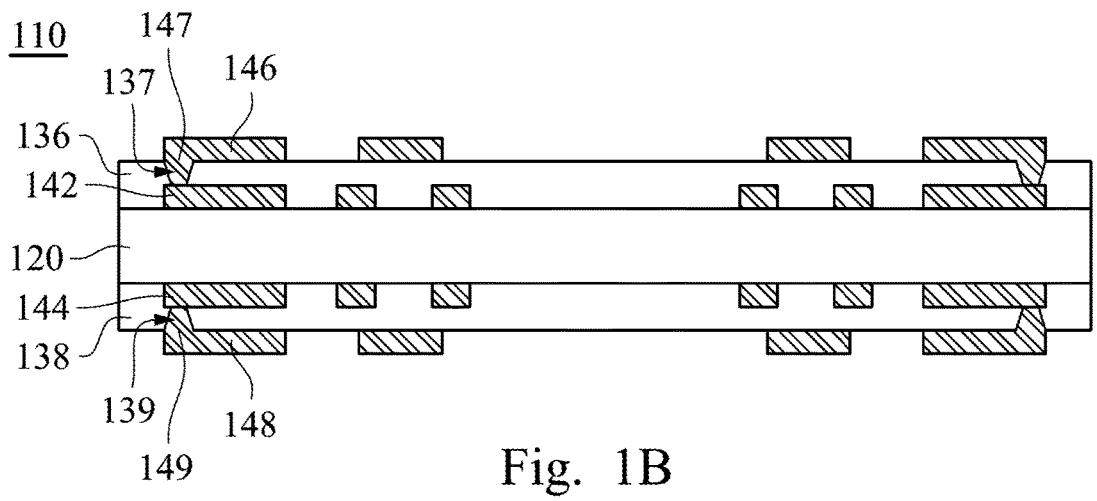

Then, as shown in FIG. 1B, a first dielectric layer 136 and a third patterned metal layer 146 are sequentially formed on the glass substrate 120, and a second dielectric layer 138 and a fourth patterned metal layer 148 are sequentially formed below the glass substrate 120.

Before the third patterned metal layer 146 is formed on the first dielectric layer 136 and the fourth patterned metal layer 148 is formed below the second dielectric layer 138, a plurality of blind holes 137 and a plurality of blind holes 139 are respectively formed in the first dielectric layer 136 and the second dielectric layer 138. Then, the third patterned metal layer 146 is formed on the first dielectric layer 136, and the fourth patterned metal layer 148 is formed below the second dielectric layer 138. The third patterned metal layer 146 has a plurality of conductive pillars 147 formed in the blind holes 137, and the fourth patterned metal layer 148 has a plurality of conductive pillars 149 formed in the blind holes 139. Therefore, the third patterned metal layer 146 is electrically connected to the first patterned metal layer 142, and the fourth patterned metal layer 148 is electrically connected to the second patterned metal layer 144.

The first dielectric layer 136 and the second dielectric layer 138 may be made of ajinomoto build-up film (ABF), pregpreg (PP), polyimide (PI), or photoimageable dielectric (PID).

The forming method of the first dielectric layer 136 and the second dielectric layer 138 may be lamination. Embodiments of this disclosure are not limited thereto. The person having ordinary skill in the art can make proper modifications to the forming method of the first dielectric layer 136 and the second dielectric layer 138.

The blind holes 137 and 139 may be formed by laser ablating the first dielectric layer 136 and the second dielectric layer 138. Embodiments of this disclosure are not limited thereto. The person having ordinary skill in the art can make proper modifications to the forming method of the blind holes 137 and 139.

The first patterned metal layer 142, the second patterned metal layer 144, the third patterned metal layer 146, and the fourth patterned metal layer 148 may be made of metal, such as copper.

The first patterned metal layer 142, the second patterned metal layer 144, the third patterned metal layer 146, and the fourth patterned metal layer 148 may be formed by plating. The detailed operations of the forming processes of the first patterned metal layer 142, the second patterned metal layer 144, the third patterned metal layer 146, and the fourth patterned metal layer 148 may include roughening surface, forming a seed layer, forming a photo-resistant layer, patterning the photo-resistant layer (i.e., operations such as exposure and development), plating to form the patterned metal layer, and stripping the photo-resistant material and the seed layer.

Figure 1C:
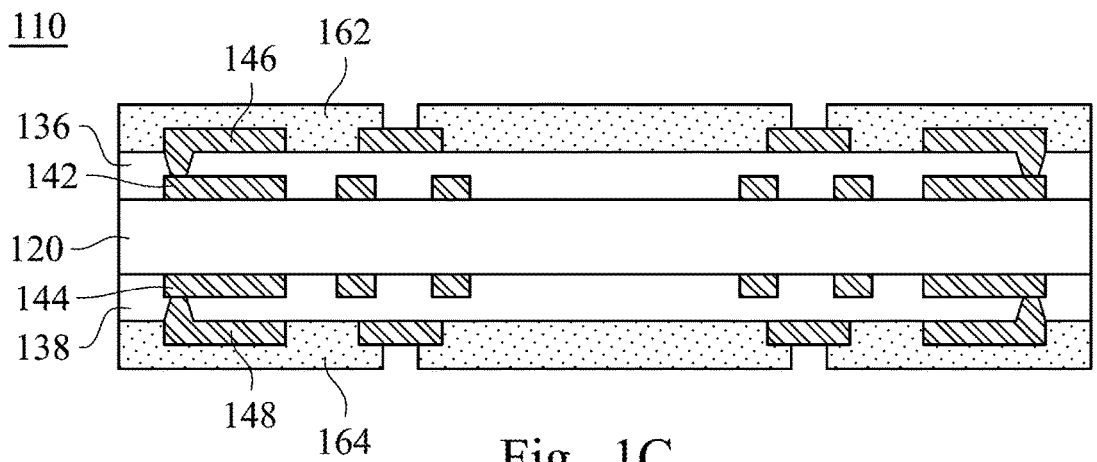

As shown in FIG. 1C, a first insulating protective layer 162 is formed on the third patterned metal layer 146 and the first dielectric layer 136, and a second insulating protective layer 164 is formed below the fourth patterned metal layer 148 and the second dielectric layer 138. The first insulating protective layer 162 and the second protective layer 164 are to protect the third patterned metal layer 146 and the fourth patterned metal layer 148 and expose a part of the third patterned metal layer 146 and a part of the fourth patterned metal layer 148, such that the third patterned metal layer 146 and the fourth patterned metal layer 148 can be electrically connected to external circuits.

The detailed operations of the forming processes of the first insulating protective layer 162 and the second insulating protective layer 164 include roughening the surface, laminating an insulating protective layer, and patterning the insulating protective layer (i.e., operations such as exposure and development). In addition, the first insulating protective layer 162 and the second insulating protective layer 164 may be made of resin, such as epoxy resin.

Figure 1D:
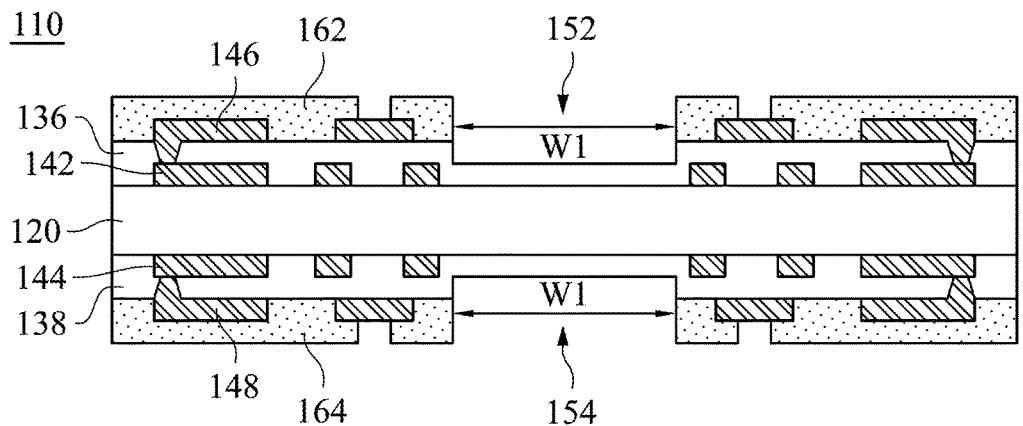

As shown in FIG. 1D, a part of the first dielectric layer 136 and a part of the first insulating protective layer 162 are removed to form at least one recess 152 in the first dielectric layer 136 and the first insulating protective layer 162, and a part of the second dielectric layer 138 and a part of the second insulating protective layer 164 are removed to form at least one recess 154 in the second dielectric layer 138 and the second insulating protective layer 164. The position of recess 152 corresponds to the position of the recess 154.

The first dielectric layer 136, the second dielectric layer 138, the first insulating protective layer 162, and the second insulating protective layer 164 are partially removed by wheel cutting, laser ablation or waterjet cutting.

When the first dielectric layer 136, the second dielectric layer 138, the first insulating protective layer 162, and the second insulating protective layer 164 are partially removed by wheel cutting, the width W1 of the recesses 152 and 154 may be in a range from about 200 μm to about 400 μm. Alternatively, the width W1 of the recesses 152 and 154 may be about 300 μm.

When the first dielectric layer 136, the second dielectric layer 138, the first insulating protective layer 162, and the second insulating protective layer 164 are partially removed by laser ablation, the width W1 of the recesses 152 and 154 may be in a range from about 5 μm to about 20 μm. Alternatively, the width W1 of the recesses 152 and 154 may be about 10 μm.

When the first dielectric layer 136, the second dielectric layer 138, the first insulating protective layer 162, and the second insulating protective layer 164 are partially removed by waterjet cutting, the width W1 of the recesses 152 and 154 may be in a range from about 5 µm to about 20 µm. Alternatively, the width W1 of the recesses 152 and 154 may be about 10 µm.

Figure 1E:
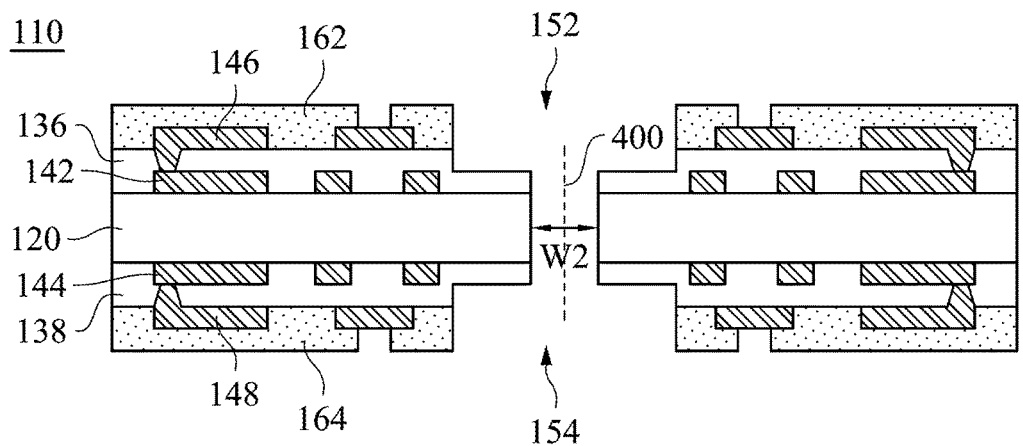
Figure 1F:
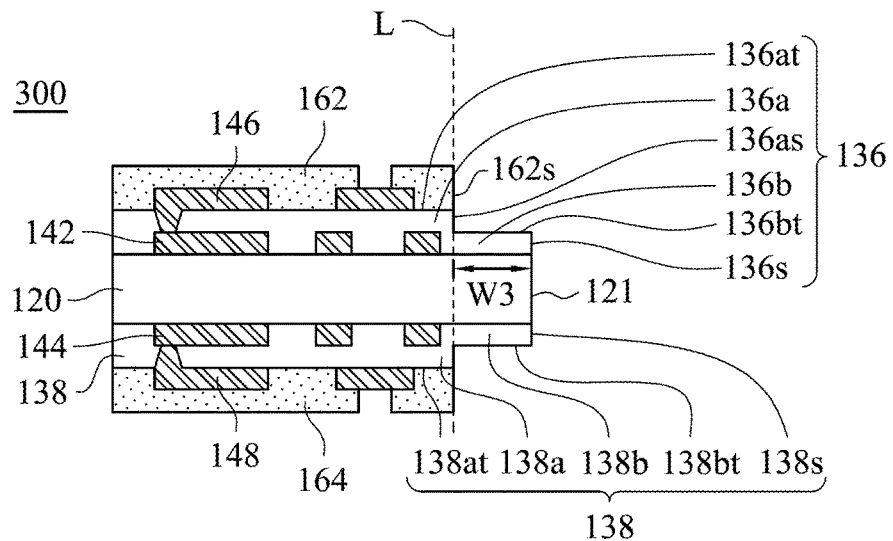

As shown in FIG. 1E and FIG. 1F, the glass substrate 120 is cut to form a passage 400, such that the circuit board structure 110 becomes a plurality of circuit board elements 300. The passage 400 divides the glass substrate 120 into different parts.

The glass substrate 120 may be cut by wheel cutting, laser ablation or waterjet cutting.

When the glass substrate 120 is cut by wheel cutting, the width W2 of the passage 400 may be in a range from about 50 µm to about 150 µm. Alternatively, the width W2 of the passage 400 may be about 100 µm.

When the glass substrate 120 is cut by laser ablation, the width W2 of the passage 400 may be in a range from about 1 µm to about 5 µm. Alternatively, the width W2 of the passage 400 may be about 2 µm.

When the glass substrate 120 is cut by waterjet cutting, the width W2 of the passage 400 may be in a range from about 1 µm to about 5 µm. Alternatively, the width W2 of the passage 400 may be about 2 µm.

As shown in FIG. 1F, a circuit board element 300 is provided. The circuit board element 300 includes a glass substrate 120, a first dielectric layer 136, a second dielectric layer 138, a first patterned metal layer. 142, and a second patterned metal layer 144. The glass substrate 120 has an edge 121. The first dielectric layer 136 and the second dielectric layer 138 are disposed on two sides of the glass substrate. The first dielectric layer 136 has a central region 136a and an edge region 136b. The edge region 136b is in contact with the edge 121 of the glass substrate 120, and the thickness of the central region 136a is greater than the thickness of the edge region 136b. The second dielectric layer 138 has a central region 138a and an edge region 138b. The edge region 138b is in contact with the edge 121 of the glass substrate 120, and the thickness of the central region 138a is greater than the thickness of the edge region 138b. The first patterned metal layer 142 is disposed on the glass substrate 120 and in the central region 136a of the first dielectric layer 136. The second patterned metal layer 144 is disposed below the glass substrate 120 and in the central region 138a of the first dielectric layer 138.

The glass substrate 120, the first dielectric layer 136, and the second dielectric layer 138 are made of different materials. The first dielectric layer 136 and the second dielectric layer 138 may be made of ajinomoto build-up film (ABF), pregpreg (PP), polyimide (PI), or photoimageable dielectric (PID).

The central region 136a has a top surface 136at, and the edge region 136b has a top surface 136bt. The top surface 136at of the central region 136 and the top surface 136bt of the edge region 136b are not located on the same plane. The central region 138a has a top surface 138at, and the edge region 138b has a top surface 138bt. The top surface 138at of the central region 138a and the top surface 138bt of the edge region 138b are not located on the same plane.

The edge 121 of the glass substrate 120 is a first side surface. The edge region 136b has a second side surface 136s, and the edge region 138b has a third side surface 138s. The first side surface, which is the edge 121, is connected to the second side surface 136s and the third side surface 138s.

The thickness of the central regions 136a and 138a may be greater than or equals to about 30 µm. Alternatively, the thickness of the central regions 136a and 138b may be about 35 µm.

The thickness of the edge regions 136b and 138b may be smaller than about 20 µm. Alternatively, the thickness of the edge regions 136b and 138b may be in a range from about 15 µm to about 20 µm.

The width W3 of the edge regions 136b and 138b may be in a range from about 50 µm to about 150 µm. Alternatively, the width W3 of the edge regions 136b and 138b may be about 100 µm.

When the reliability test of a conventional circuit board element is performed, the circuit board element will experience high and low temperatures, and thermal stress of the dielectric layer will be applied to the edges of the glass substrate when the dielectric layer experiences high and low temperatures. Since there may be small defects on the edges of the glass substrate due to the cutting process, the thermal stress applied to the glass substrate by the dielectric layer may break the glass substrate, such that the circuit board element may become damaged.

In the aforementioned embodiments, the thickness of the edge region 136b of the first dielectric layer 136 and the edge region 138b of the second dielectric layer 138 is smaller, so the thermal stress applied to the edge 121 of the glass substrate 120 by the first dielectric layer 136 and the second dielectric layer 138 will be smaller, such that the small defects will not be affected by the thermal stress and the glass substrate 120 will not be broken. Therefore, the circuit board element 300 can pass the reliability test.

The circuit board element 300 may further include a first insulating protective layer 162 and a second insulating protective layer 164. The first insulating protective layer 162 is disposed on the third patterned metal layer 146 and the central region 136a of the first dielectric layer 136, and an extending line L of a side surface 136as of the central region 136a and a side surface 162s of the insulating protective layer 162 intersects the glass substrate 120. The second insulating protective layer 164 is disposed below the fourth patterned metal layer 148 and the central region 138a of the first dielectric layer 138. The first insulating protective layer 162 and the second protective layer 164 are to protect the third patterned metal layer 146 and the fourth patterned metal layer 148 and expose a part of the third patterned metal layer 146 and a part of the fourth patterned metal layer 148, such that the third patterned metal layer 146 and the fourth patterned metal layer 148 can be electrically connected to external circuits.

In the aforementioned embodiments, only one end of the glass substrate 120 of the circuit board element 300 is cut. Embodiments of this disclosure are not limited thereto. In other embodiment, two ends or all edges of the glass substrate 120 may be cut. Therefore, the edge region 136b of the first dielectric layer 136 and the edge region 138b of the second dielectric layer 138 will be disposed on two ends of all edges of the glass substrate 120.

In the aforementioned embodiments, the circuit board element 300 includes two two-layered-patterned-metal-layer structures. Embodiments of this disclosure are not limited thereto. In other embodiments, the circuit board element 300 may include two single-layered-patterned-metal-layer structures, or the circuit board element 300 may include two three-layered-patterned-metal-layer structures.

Figure 2:
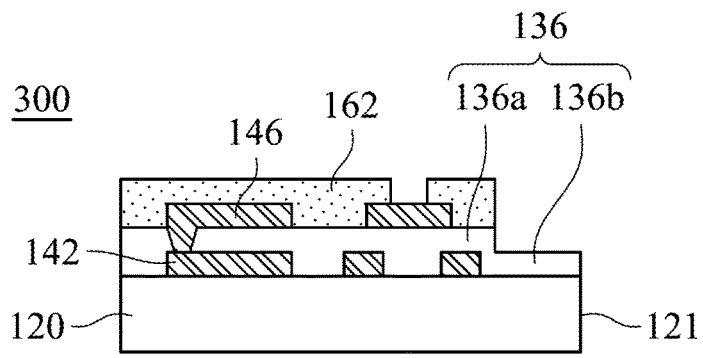
FIG. 2 is a schematic cross-sectional view of the circuit board element according to another embodiment of this disclosure.

FIG. 2 is a schematic cross-sectional view of the circuit board element 300 according to another embodiment of this disclosure. As shown in FIG. 2, the circuit board element 300 of this embodiment is similar to the circuit board element 300 of the aforementioned embodiments, and the main difference is that, in this embodiment, the circuit board element 300 does not include the second patterned metal layer 144 (see FIG. 1F), the second dielectric layer 138 (see FIG. 1F), and the second insulating protective layer 164 (see FIG. 1F). In other words, components of the circuit board element 300 are disposed only on one side of the glass substrate 120.

Figure 3:
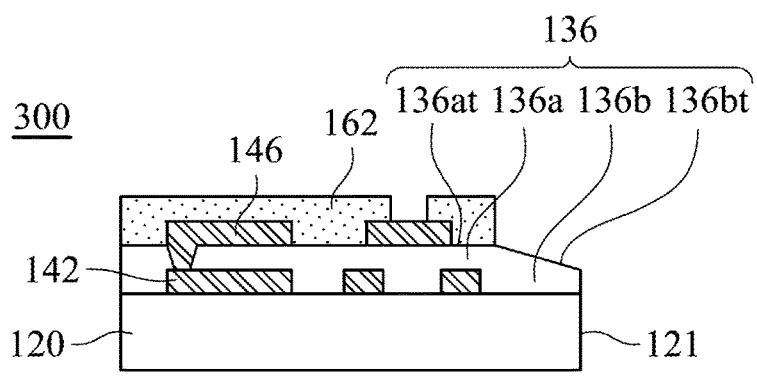
FIG. 3 is a schematic cross-sectional view of the circuit board element according to another embodiment of this disclosure.

FIG. 3 is a schematic cross-sectional view of the circuit board element 300 according to another embodiment of this disclosure. As shown in FIG. 3, the circuit board element 300 of this embodiment is similar to the circuit board element 300 of FIG. 2, and the main difference is that, in this embodiment, the top surface 136bt of the edge region 136b is an inclined surface relative to the top surface 136at of the central region 136a.

Figure 4:
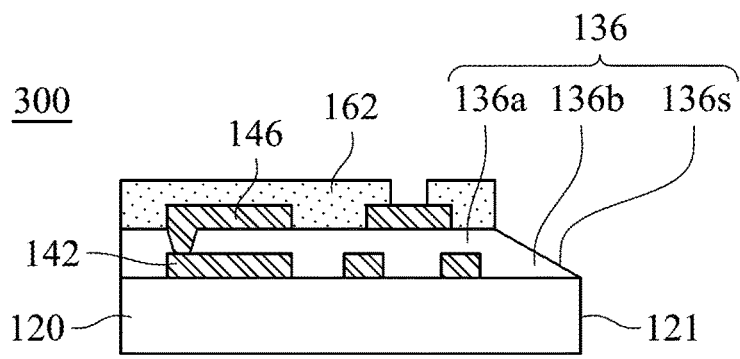
FIG. 4 is a schematic cross-sectional view of the circuit board element according to another embodiment of this disclosure.

FIG. 4 is a schematic cross-sectional view of the circuit board element 300 according to another embodiment of this disclosure. As shown in FIG. 4, the circuit board element 300 of this embodiment is similar to the circuit board element 300 of FIG. 2, and the main difference is that, in this embodiment, the edge region 136b doe not include the top surface, and the second side surface 136s of the edge region 136b is an inclined surface relative to the edge 121 (i.e., the first side surface).

Figure 5:
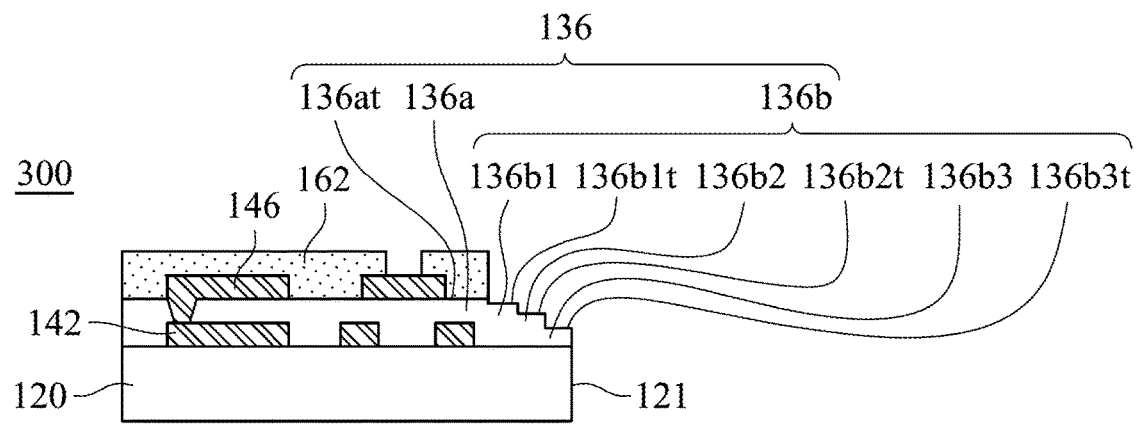
FIG. 5 is a schematic cross-sectional view of the circuit board element according to another embodiment of this disclosure.

FIG. 5 is a schematic cross-sectional view of the circuit board element 300 according to another embodiment of this disclosure. As shown in FIG. 5, the circuit board element 300 of this embodiment is similar to the circuit board element 300 of FIG. 2, and the main differences are described below.

As shown in FIG. 5, the edge region 136b is further divided into a plurality of sub-regions, such as a sub-region 136b1, a sub-region 136b2, and a sub-region 136b3, and thicknesses of the sub-regions are different from each other. At the same time, any two of the top surface 136at of the central region 136 and the top surfaces of the sub-regions are not located on the same plane. For example, in this embodiment, the sub-region 136b1 has a top surface 136b1t, the sub-region 136b2 has a top surface 136b2, and the sub-region 136b3 has a top surface 136b3t. Any two of the top surface 136at, 136b1t, 136b2t, and 136b3t are not located on the same plane.

Figure 6:
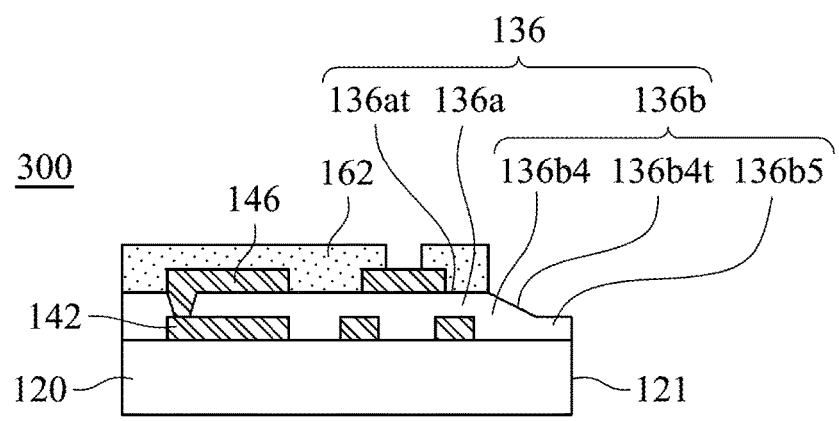
FIG. 6 is a schematic cross-sectional view of the circuit board element according to another embodiment of this disclosure.

FIG. 6 is a schematic cross-sectional view of the circuit board element 300 according to another embodiment of this disclosure. As shown in FIG. 6, the circuit board element 300 of this embodiment is similar to the circuit board element 300 of FIG. 2, and the main differences are described below.

As shown in FIG. 6, the edge region 136b is further divided into a plurality of sub-regions, such as a sub-region 136b4 and a sub-region 136b5, and at least one of the top surfaces of the sub-regions is an inclined surface relative to the top surface 136at of the central region 136a. For example, in this embodiment, the sub-region 136b4 has a top surface 136b4t. The top surface 136b4t of the sub-region 136b4 is an inclined surface relative to the top surface 136at of the central region 136a.

When the reliability test of a conventional circuit board element is performed, the circuit board element will experience high and low temperatures, and thermal stress of the dielectric layer will be applied to the edges of the glass substrate when the dielectric layer experiences high and low temperatures. Since there may be small defects on the edges of the glass substrate due to the cutting process, the thermal stress applied to the glass substrate by the dielectric layer may break the glass substrate, such that the circuit board element may become damaged.

In the aforementioned embodiments, the thickness of the edge region 136b of the first dielectric layer 136 and the edge region 138b of the second dielectric layer 138 is smaller, so the thermal stress applied to the edge 121 of the glass substrate 120 by the first dielectric layer 136 and the second dielectric layer 138 will be smaller, such that the small defects will not be affected by the thermal stress and the glass substrate 120 will not be broken. Therefore, the circuit board element 300 can pass the reliability test.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A circuit board element, comprising:
 a glass substrate having an edge;
 a first dielectric layer disposed on the glass substrate and having a central region and an edge region, wherein the edge region is in contact with the edge of the glass substrate, and a thickness of the central region is greater than a thickness of the edge region;
 a first patterned metal layer disposed on the glass substrate and in the central region of the first dielectric layer; and
 an insulating protective layer disposed on the first patterned metal layer and the central region of the first dielectric layer, wherein the central region of the first dielectric layer has a first side surface, the insulating protective layer has a second side surface, and the first side surface is connected to the second side surface, and an extending line of the first side surface and the second side surface intersects the glass substrate.

2. The circuit board element of claim 1, wherein the glass substrate and the first dielectric layer are made of different materials.

3. The circuit board element of claim 1, wherein the first dielectric layer is made of ajinomoto build-up film (ABF), pregpreg (PP), polyimide (PI), or photoimageable dielectric (PID).

4. The circuit board element of claim 1, wherein the central region has a top surface, the edge region has a top surface, and the top surface of the central region and the top surface of the edge region are not located on the same plane.

5. The circuit board element of claim 4, wherein the top surface of the edge region is an inclined surface relative to the top surface of the central region.

6. The circuit board element of claim 1, wherein the edge region is further divided into a plurality of sub-regions, and thicknesses of the sub-regions are different from each other.

7. The circuit board element of claim 6, wherein the central region has a top surface, each of the sub-regions has a top surface, and any two of the top surface of the central region and the top surfaces of the sub-regions are not located on the same plane.

8. The circuit board element of claim 6, wherein the central region has a top surface, each of the sub-regions has a top surface, and at least one of the top surfaces of the sub-regions is an inclined surface relative to the top surface of the central region.

9. The circuit board element of claim 1, wherein the edge of the glass substrate is a third side surface, the edge region has a fourth side surface, and the third side surface is connected to the fourth side surface.

10. The circuit board element of claim 9, wherein the fourth side surface is an inclined surface relative to the third side surface.

\* \* \* \* \*